United States Patent
Kitagawa

(10) Patent No.: US 10,419,696 B2
(45) Date of Patent: Sep. 17, 2019

(54) INFRARED IMAGING DEVICE AND SIGNAL CORRECTION METHOD USING INFRARED IMAGING DEVICE

(71) Applicant: FUJIFILM Corporation, Tokyo (JP)

(72) Inventor: Junya Kitagawa, Saitama (JP)

(73) Assignee: FUJIFILM Corporation, Tokyo (JP)

(*) Notice: Subject to any disclaimer, the term of this patent is extended or adjusted under 35 U.S.C. 154(b) by 147 days.

(21) Appl. No.: 15/814,872

(22) Filed: Nov. 16, 2017

(65) Prior Publication Data

US 2018/0084205 A1 Mar. 22, 2018

Related U.S. Application Data

(63) Continuation of application No. PCT/JP2016/002354, filed on May 13, 2016.

(30) Foreign Application Priority Data

May 21, 2015 (JP) ................................. 2015-103565

(51) Int. Cl.
*H04N 5/357* (2011.01)
*G01J 1/42* (2006.01)
(Continued)

(52) U.S. Cl.
CPC ............... *H04N 5/357* (2013.01); *G01J 1/42* (2013.01); *H01L 27/14649* (2013.01);
(Continued)

(58) Field of Classification Search
CPC ........ G01J 1/42; G01J 1/02; G01J 2005/0048; G01J 2005/0077; H04N 5/2258;
(Continued)

(56) References Cited

U.S. PATENT DOCUMENTS 6,583,416 B1   6/2003  Villani
2003/0091090 A1  5/2003  Schieferdecker et al.
(Continued)

FOREIGN PATENT DOCUMENTS

CN   1636129 A   7/2005
CN  104580946 A   4/2015
(Continued)

OTHER PUBLICATIONS

Chinese Office Action and Search Report, dated Mar. 21, 2019, for Chinese Application No. 201680028969.7, with English translation of the Chinese Office Action.
(Continued)

*Primary Examiner* — Anand S Rao
*Assistant Examiner* — Tyler B Edwards
(74) *Attorney, Agent, or Firm* — Birch, Stewart, Kolasch & Birch, LLP

(57) ABSTRACT

Provided are an infrared imaging device and a signal correction method using the infrared imaging device capable of reducing noise due to a variation of pixel signals of an infrared image even in a case where the variation of the pixel signals of the infrared image is changed. An infrared imaging device includes an optical system, a detection unit that includes an effective pixel portion in which effective pixels that are infrared detection elements are arranged in a matrix form in an effective region onto which infrared rays from the optical system are incident and a reference pixel portion in which a plurality of reference pixels that are the infrared detection elements are arranged in a reference region onto which the infrared rays from the optical system are not incident, and is positioned on an imaging surface of the optical system; and a signal correction unit that performs a correction process with respect to a pixel signal detected by the detection unit. The signal correction unit performs a
(Continued)

variation correction process of calculating a reference variation value indicating a variation of pixel signals of the plurality of reference pixels included in the reference pixel portion and reducing a variation of pixel signals of the effective pixels to become smaller as the reference variation value becomes larger.

14 Claims, 10 Drawing Sheets

(51) Int. Cl.
*H04N 5/33* (2006.01)
*H04N 5/225* (2006.01)
*H04N 5/361* (2011.01)
*H04N 5/365* (2011.01)
*H01L 27/146* (2006.01)
*H04N 17/00* (2006.01)
*H04N 5/369* (2011.01)
*G01J 5/00* (2006.01)

(52) U.S. Cl.
CPC .............. *H04N 5/2258* (2013.01); *H04N 5/33* (2013.01); *H04N 5/361* (2013.01); *H04N 5/365* (2013.01); *H04N 5/36963* (2018.08); *H04N 17/002* (2013.01); *G01J 2005/0048* (2013.01); *G01J 2005/0077* (2013.01)

(58) Field of Classification Search
CPC .......... H04N 5/33; H04N 5/357; H04N 5/361; H04N 5/365; H04N 17/002; H04N 5/36963; H01L 27/144; H01L 27/14649
See application file for complete search history.

(56) References Cited

U.S. PATENT DOCUMENTS

| | | |
|---|---|---|
| 2004/0159788 A1 | 8/2004 | Shigenaka et al. |
| 2006/0279632 A1 | 12/2006 | Anderson |
| 2012/0091340 A1* | 4/2012 | Young ...................... H04N 5/33 250/332 |
| 2014/0016879 A1* | 1/2014 | Hogasten ................. H04N 5/33 382/264 |
| 2014/0160259 A1 | 6/2014 | Blanquart et al. |
| 2015/0109490 A1 | 4/2015 | Kanemitsu et al. |

FOREIGN PATENT DOCUMENTS

| | | |
|---|---|---|
| JP | 10-23335 A | 1/1998 |
| JP | 2004-245692 A | 9/2004 |
| JP | 2007-194733 A | 8/2007 |
| JP | 2008-160561 A | 7/2008 |
| WO | WO 2014/018948 A2 | 1/2014 |

OTHER PUBLICATIONS

International Preliminary Report on Patentability (Form PCT/IPEA/409), issued in International Application No. PCT/JP2016/002354 dated May 11, 2017, together with an English translation.
International Search Report and Written Opinion of the International Searching Authority issued in International Application No. PCT/JP2016/002354 dated Sep. 27, 2016, together with an English translation of the International Search Report.

* cited by examiner

FIG. 10B
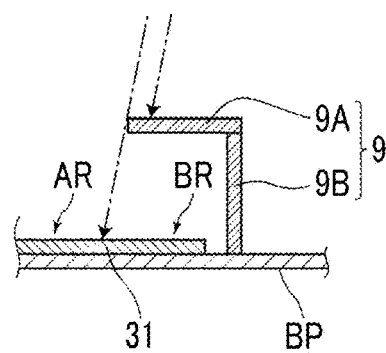
FIG. 11
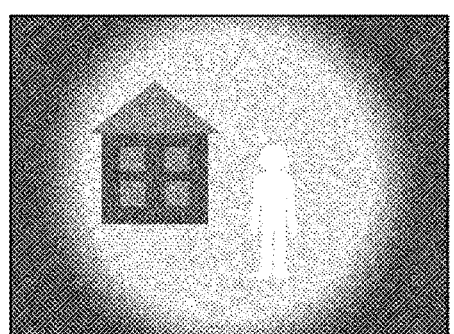
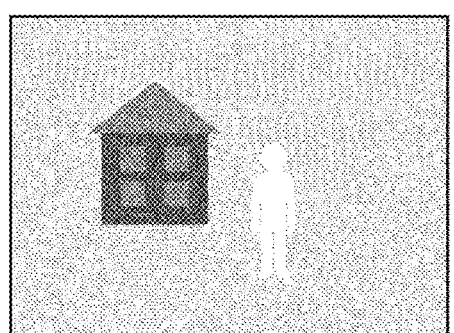

INFRARED IMAGING DEVICE AND SIGNAL CORRECTION METHOD USING INFRARED IMAGING DEVICE

CROSS-REFERENCE TO RELATED APPLICATION

The present application is a Continuation of PCT International Application No. PCT/JP2016/002354 filed on May 13, 2016, which claims priority under 35 U.S.C. § 119(a) to Japanese Patent Application No. 2015-103565 filed on May 21, 2015. Each of the above applications is hereby expressly incorporated by reference, in its entirety, into the present application.

BACKGROUND

Technical Field

The present invention relates to an infrared imaging device that captures an infrared image and a signal correction method using the infrared imaging device, and particularly, to an infrared imaging device that corrects pixel signals of an infrared image and a signal correction method using the infrared imaging device.

Related Art

In recent years, in an imaging device that captures an infrared image, as an image sensor in which infrared detection elements are arranged in a matrix form, a bolometer type image sensor that detects infrared rays using the fact that a resistance value varies in accordance with temperature fluctuation has been used. JP2004-245692A discloses a technique in which in such a bolometer type image sensor, an image area onto which infrared rays are incident and a non-image area onto which infrared rays are not incident are provided in the image sensor in order to cancel noise due to Joule heat of a bias current for accumulating signals based on infrared rays, and in which a bias current that flows in an infrared detection element in the image area is offset-controlled according to an electric signal of an infrared detection element in the non-image area.

SUMMARY

Here, on the basis of new researches of inventors of this application, FIG. 1 is a time series graph in which a transverse axis represents a time axis and a longitudinal axis represents a dispersion of pixel signals of an infrared image detected by an image sensor in a specific measurement target region. According to analysis of the inventors of this application, since a noise feature of an image sensor is changed according to factors such as temperature fluctuation of the sensor itself, as shown in FIG. 1, it can be understood that a variation of pixel signals detected by the image sensor nonlinearly varies at each time point.

Here, in a case where a variation of pixel signals is nonlinearly changed at each time point, a comparative example in which a variation correction process of reducing a variation of pixel signals at common correction intensity with respect to each of infrared images detected by an image sensor is performed will be described. FIG. 13 shows a corrected image It1_p and a corrected image It2_p obtained by correcting a variation of pixel signals at a common correction intensity with respect to an infrared image It1 at a point of time t1 in FIG. 1 and an infrared image It2 at a point of time t2 in FIG. 1, respectively, as a comparative example. In a case where a variation of pixel signals becomes larger, noise such as a white point or a black point irrelevant to an imaging target in an infrared image becomes larger. FIG. 13 shows an example in which the infrared image It2 has a relatively large variation of pixel signals compared with that of the infrared image It1.

As in the comparative example shown in FIG. 13, in a case where the variation correction process is performed at the common correction intensity, even in a case where the corrected image It1_p in which a variation of pixel signals is appropriately reduced with respect to one infrared image It1 can be obtained, it is not possible to handle increase in a variation of pixel signals with respect to the other infrared image It2, the variation of the pixel signals cannot be sufficiently reduced, as indicated by the corrected image It2_p, which results in insufficient correction. Contrarily, in a case where the variation correction process is performed at the common correction intensity with respect to an infrared image having a small variation of pixel signals compared with that of the infrared image It1, the variation of the pixel signals cannot be sufficiently reduced, which results in excessive correction. Thus, a technique that reduces noise due to a variation of pixel signals of an infrared image even in a case where the variation of the pixel signals of the infrared image is changed is necessary. However, since the technique disclosed in JP2004-245692A is a technique that offset-controls a bias current in the unit of an address line, it is not possible to reduce a variation of pixel signals of an infrared image.

The invention has been made in consideration of the above-mentioned problems, and an object of the invention is to provide an infrared imaging device that reduces noise due to a variation of pixel signals of an infrared image even in a case where the variation of the pixel signals of the infrared image is changed, and a signal correction method using the infrared imaging device.

According to an aspect of the invention, there is provided an infrared imaging device comprising: an optical system; a detection unit that includes an effective pixel portion in which effective pixels that are infrared detection elements are arranged in a matrix form in an effective region onto which infrared rays from the optical system are incident and a reference pixel portion in which a plurality of reference pixels that are the infrared detection elements are arranged in a reference region onto which the infrared rays from the optical system are not incident, and is positioned on an imaging surface of the optical system; and a signal correction unit that performs a correction process with respect to a pixel signal detected by the detection unit, in which the signal correction unit performs a variation correction process of calculating a reference variation value indicating a variation of pixel signals of the plurality of reference pixels included in the reference pixel portion and reducing a variation of pixel signals of the effective pixels to become smaller as the reference variation value becomes larger.

According to another aspect of the invention, there is provided a signal correction method using an infrared imaging device including an optical system, a detection unit that includes an effective pixel portion in which effective pixels that are infrared detection elements are arranged in a matrix form in an effective region onto which infrared rays from the optical system are incident and a reference pixel portion in which a plurality of reference pixels that are the infrared detection elements are arranged in a reference region onto which the infrared rays from the optical system are not incident, and is positioned on an imaging surface of the optical system, and a signal correction unit that performs a correction process with respect to a pixel signal detected by the detection unit, the method comprising: a detection step of detecting pixel signals of the effective pixels and pixel signals of the reference pixels; and a signal correction step of performing a variation correction process of calculating a reference variation value indicating a variation of the pixel signals of the plurality of reference pixels included in the reference pixel portion and reducing a variation of the pixel signals of the effective pixels to become smaller as the reference variation value becomes larger.

Here, the "reference region onto which the infrared rays from the optical system are not incident" means that the reference region is configured so that the infrared image from the optical system is not incident by a certain method". For example, the reference region may be configured so that the infrared rays are not incident onto the reference region by providing the reference region so as not to overlap an imaging region of the optical system, or may be configured so that the infrared rays are not incident onto the reference region by shielding direct incidence of the infrared rays from the optical system using a shield.

The "reference variation value" means a value indicating the variation of the pixel signals of the plurality of reference pixels included in the reference pixel portion. The reference variation value may be defined by an arbitrary method indicating the variation of the pixel signals of the plurality of reference pixels included in the reference pixel portion. For example, the reference variation value may be a value indicating a statistical variation such as a dispersion or a standard deviation of the pixel signals of the plurality of reference pixels included in the reference pixel portion, or a value indicating a range of a distribution of the pixel signals of the reference pixel portion, such as a difference between a maximum value and a minimum value of the pixel signals of the plurality of reference pixels included in the reference pixel portion.

In the infrared imaging device according to the aspects of the invention, the detection unit may be configured as a single image sensor that includes the reference pixel portion and the effective pixel portion.

In this case, the reference pixel portion may include a plurality of partial reference pixel portions that are positioned to be adjacent to the effective pixel portion.

In the infrared imaging device according to the aspects of the invention, in a case where the reference pixel portion includes the plurality of partial reference pixel portions that are positioned to be adjacent to the effective pixel portion, the signal correction unit may calculate, with respect to each of the plurality of partial reference pixel portions, a partial reference variation value indicating a variation of the partial reference pixel portion, and determine an average value of the plurality of partial reference variation values as the reference variation value.

In the infrared imaging device according to the aspects of the invention, in a case where the reference pixel portion includes the plurality of partial reference pixel portions that are positioned to be adjacent to the effective pixel portion, the signal correction unit may calculate, with respect to each of the plurality of partial reference pixel portions, a partial reference variation value, and determine a maximum value or a minimum value of the plurality of partial reference variation values as the reference variation value.

In the infrared imaging device according to the aspects of the invention, in a case where the reference pixel portion includes the plurality of partial reference pixel portions that are positioned to be adjacent to the effective pixel portion, it is preferable that the plurality of partial reference pixel portions include first and second partial reference pixel portions that face each other with the center of the effective region being interposed therebetween in a first direction and third and fourth partial reference pixel portions that face each other with the center of the effective region being interposed therebetween in a second direction different from the first direction.

The "reference pixel portion is positioned to be adjacent to the effective pixel portion" means that the reference pixel portion is positioned at a distance that is sufficiently short from the effective pixel portion such that the reference pixel portion and the effective pixel portion are considered to be adjacent to each other. The reference pixel portion may be directly adjacent to the effective pixel portion, but may not be directly adjacent to the effective pixel portion as long as the shortest distance from the effective pixel portion is positioned in a sufficiently short distance in a range where it is not included in an imaging region.

In the infrared imaging device according to the aspects of the invention, the detection unit may include a first image sensor having the effective pixel portion and a second image sensor that has the same temperature characteristic as that of the first image sensor and has the reference pixel portion, in which the second image sensor is positioned in the vicinity of the first image sensor.

In this case, it is preferable that the reference pixels are provided on the entire detection surface of the second image sensor and the signal correction unit calculates a reference variation value indicating a variation of pixel signals of all reference pixels included in the reference pixel portion.

The second image sensor having the "same temperature characteristic as that of the first image sensor" means that under a thermal environment that a structure of an infrared element provided in the first image sensor and a structure of an infrared element provided in the second image sensor are the same and temperatures due to external factors such as a substrate temperature and a casing temperature of an infrared imaging device are equivalent to each other, the second image sensor is configured to show fluctuation of pixel signals that are the same as in the first image sensor. For example, the second image sensor may be configured as a product having the same specification as that of the first image sensor.

The "second image sensor is positioned in the vicinity of the first image sensor" means that the second image sensor is positioned in a range where a temperature due to external factors such as a substrate temperature and a casing temperature of an infrared imaging device is equivalent to that of the first image sensor. For example, the first image sensor and the second image sensor may be provided to be adjacent to a first surface of the substrate (a surface close to the optical system). Further, for example, the first image sensor and the second image sensor may be respectively provided at corresponding positions of the first surface and a second surface (a surface distant from the optical system).

In the infrared imaging device according to the aspects of the invention, the reference pixel portion may be provided at a position excluding the imaging region of the optical system.

In the infrared imaging device according to the aspects of the invention, a shield unit that shields incidence of infrared rays onto the reference pixels from the optical system may be further provided.

In the infrared imaging device according to the aspects of the invention, the signal correction unit may correct, with respect to a pixel signal of each of the effective pixels, the pixel signal of the effective pixel so that as the reference variation value becomes larger, a difference between a value of the pixel signal of each effective pixel and an average value of pixel signals of a plurality of peripheral pixels that are positioned in the vicinity of the effective pixel becomes smaller, to thereby perform the variation correction process.

The "plurality of peripheral pixels that are positioned in the vicinity of the effective pixel" means a plurality of effective pixels other than the effective pixel, which are selected to satisfy a specific positional relationship with the effective pixel. The peripheral pixels may employ other effective pixels that are not directly adjacent to the effective pixels as long as they are positioned in distances that are sufficiently close to the effective pixel. For example, among a plurality of effective pixels that are included in a range of 3×3 pixels or 5×5 pixels around a target effective pixel, arbitrary effective pixels other than the central effective pixel may be used as the peripheral pixels.

In the infrared imaging device according to the aspects of the invention, the signal correction unit may perform the variation correction process in a case where the difference between the value of the pixel signal of the effective pixel and the average value of the pixel signals of the plurality of peripheral pixels that are positioned in the vicinity of the effective pixel satisfies a first threshold value condition.

In the infrared imaging device according to the aspects of the invention, it is preferable that the signal correction unit calculates the reference variation value, calculates a correction intensity indicating the degree of reduction of the variation of the pixel signals of the effective pixels according to the calculated reference variation value, and reduces the variation of the pixel signals of the effective pixels to become smaller according to the calculated correction intensity to perform the variation correction process, and that the signal correction unit performs a correction intensity updating process of calculating the reference variation value and updating and calculating the correction intensity according to the calculated reference variation value.

In this case, the signal correction unit may acquire a pixel signal of the reference pixel portion, and in a case where a difference between the acquired pixel signal of the reference pixel portion and a pixel signal of the reference pixel portion in the previous correction intensity calculation process satisfies a second threshold value condition, the signal correction unit may perform the correction intensity updating process.

According to the infrared imaging device of the invention and the signal correction method using the infrared imaging device of the invention, even in a case where a variation of pixel signals of an infrared image is changed, it is possible to suitably reduce noise due to a variation of the pixel signals of the infrared image.

BRIEF DESCRIPTION OF THE DRAWINGS

Exemplary embodiments of the present invention will be described in detail based on the following figures, wherein:

FIG. 10B is a sectional view of a cut portion, showing an AA section in FIG. 10A.

FIG. 11 is a diagram showing an infrared image before correction and an infrared image after correction according to a seventh embodiment.

DETAILED DESCRIPTION

Figure 2:
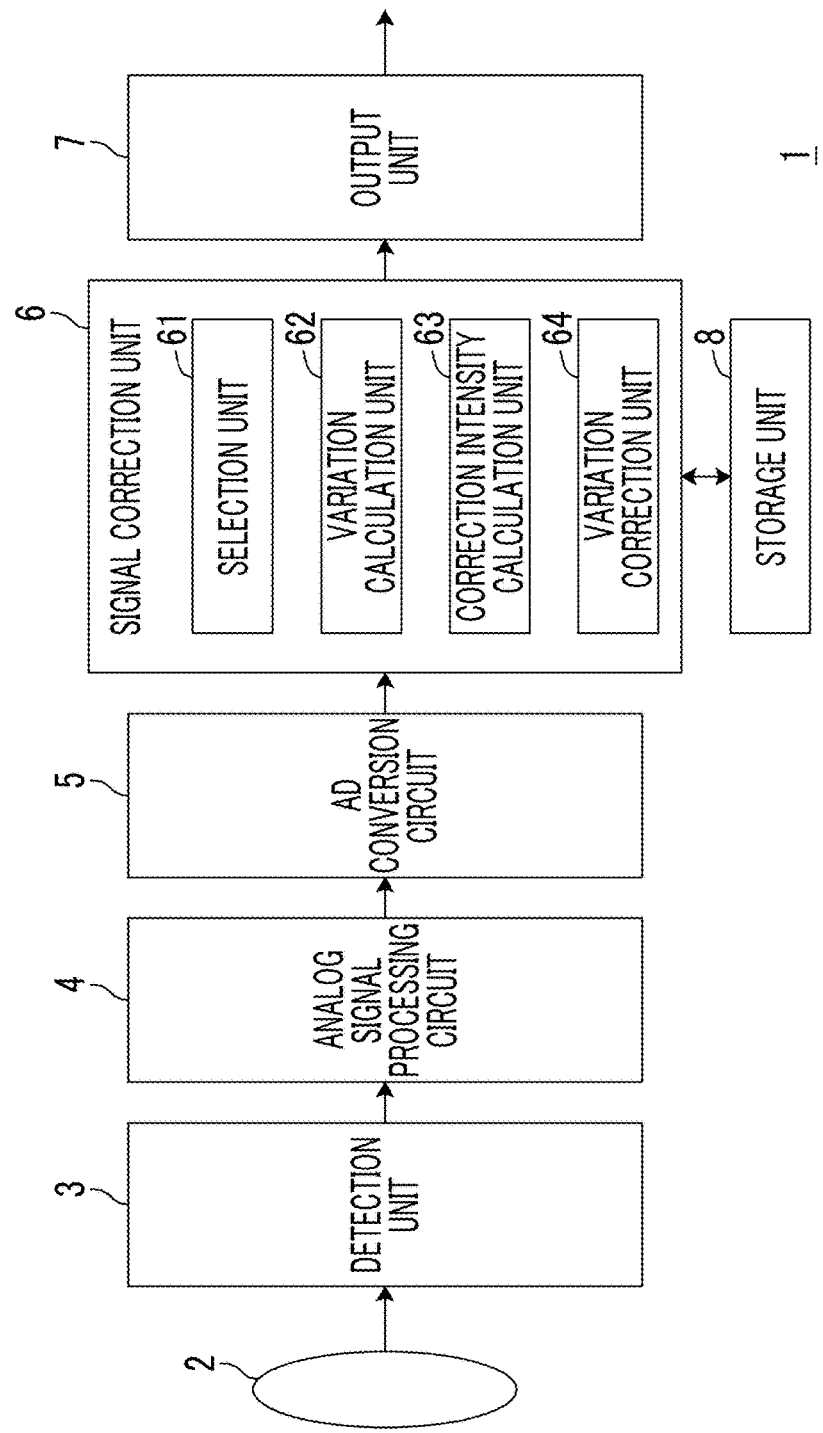
FIG. 2 is a schematic block diagram showing a configuration of an infrared imaging device according to an embodiment of the invention.

Hereinafter, embodiments of the invention will be described with reference to the accompanying drawings. FIG. 2 is a schematic block diagram showing a configuration of an infrared imaging device 1 according to an embodiment of the invention.

First, the infrared imaging device 1 includes an optical system 2 for infrared imaging, a detection unit 3 that is positioned on an imaging surface of the optical system 2 and includes an image sensor (not shown in FIG. 2, which will be described later) that detects infrared rays that pass through the optical system 2, an analog signal processing circuit 4 that performs known analog signal processing including an amplification process with respect to pixel signals detected by the image sensor (which will be described later), an AD conversion circuit 5 that performs analog-to-digital conversion (AD conversion) with respect to the pixel signals subjected to the analog signal processing, a signal correction unit 6 that is a digital signal processor that performs various signal correction processes including a variation correction process according to the embodiment of the invention with respect to an infrared image that is configured by digital signals obtained through the AD conversion process, a storage unit 8 that stores a variety of data used by the signal correction unit 6, and an output unit 7 that outputs an infrared image corrected by the signal correction unit 6. Further, the infrared imaging device 1 includes a control unit and a control mechanism (which are not shown) that perform control for capturing an infrared image, for example.

The storage unit 8 includes a volatile memory such as a dynamic random access memory (DRAM) and a non-volatile memory such as a flash memory that store a variety of information used in the signal correction unit 6, infrared images subjected to a variety of digital signal processing, or the like as necessary. The output unit 7 outputs the infrared images subjected to the variety of digital signal processing including the variation correction process according to the embodiment of the invention to an external storage unit and a display unit (which are not shown), through wireless or wired communication. Here, the external storage unit (not shown) includes a variety of storage media such as a hard disk. For example, the external storage unit may be configured as an auxiliary storage device of a memory card type. The display unit (not shown) includes a known display such as a liquid crystal type display, and displays an output infrared image. Here, the storage unit 8 and the signal correction unit 6 are mounted on a single integrated circuit chip. However, the invention is not limited thereto, and the storage unit 8 and the signal correction unit 6 may be mounted on different integrated circuit chips.

Figure 3:
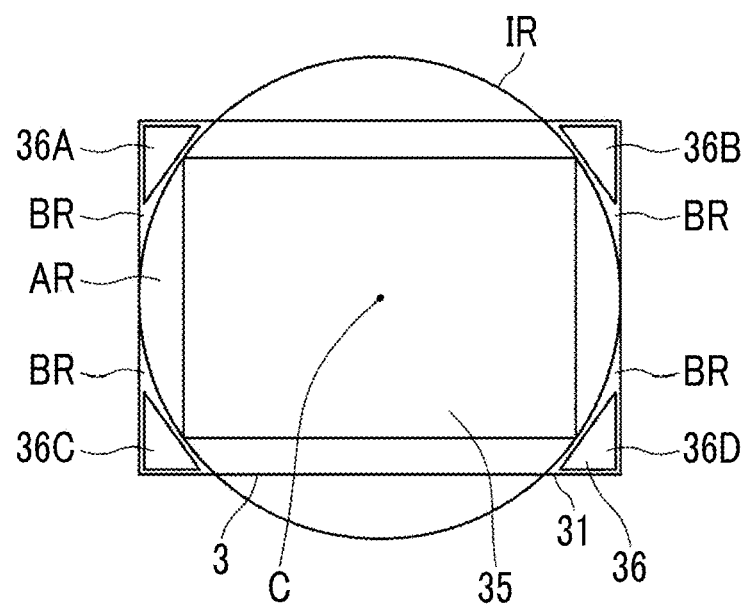
FIG. 3 is a schematic view showing a detection unit according to first and second embodiments.

The detection unit 3 includes one or more image sensors in which a plurality of infrared detection elements are positioned in a matrix form. FIG. 3 is a schematic view of a first image sensor 31 according to a first embodiment. One or more image sensors included in the detection unit 3 include an effective pixel portion 35 in which effective pixels which are infrared detection elements are arranged in a matrix form in an effective region AR onto which infrared rays passed through the optical system 2 are incident, and a reference pixel portion 36 in which a plurality of reference pixels which are infrared detection elements are arranged in a reference region BR onto which infrared rays passed through the optical system 2 are not incident. The effective pixel portion 35 detects image signals corresponding to an infrared image, and the reference pixel portion 36 detects image signals for being used in an image correction process of the infrared image. Hereinafter, among one or more image sensors included in the detection unit 3, an image sensor having the effective pixel portion 35 is referred to as the first image sensor 31. In a case where the detection unit 3 includes a different image sensor that does not include the effective pixel portion 35, the different image sensor is referred to as a second image sensor 32.

Here, the effective pixels and the reference pixels are infrared detection elements (infrared detectors) capable of detecting infrared rays (a wavelength of 0.7 µm to 1 mm), particularly, infrared detection elements capable of detecting far infrared rays (a wavelength of 4 µm to 1 mm). For example, bolometer type infrared detection elements may be used as the infrared detection elements used as the effective pixels and the reference pixels. Further, in respective embodiments of the invention, infrared detection elements having the same structure are used as effective elements on which infrared ray are incident or reference pixels on which infrared rays are not incident according to a method for differentiating the presence and absence of incidence of infrared rays, instead of a method for differentiating the presence and absence of a heat detection unit that detects infrared rays or structures of heat detection units. As the effective pixel portion 35 that includes the effective pixels and the reference pixel portion 36 that includes the reference pixels are used, there is no case in which differences between pixel values of the effective pixels and the reference pixels (differences between pixel signals of the effective pixels and pixel signals of the reference pixels) occur due to structures of heat detection units or a difference of heat characteristics due to a difference between the structures of the heat detection units. Accordingly, it is possible to calculate values to be used in a variation correction process (which will be described later) with high accuracy using the reference pixels. In each diagram, with respect to the first image sensor 31 and the second image sensor 32, only their detection regions are schematically shown. The first image sensor 31 (and the second image sensor 32) includes one detection region, and is provided with a plurality of infrared detection elements having the same structure (common structure) in one detection region.

As shown in the first image sensor 31 in FIG. 3, the detection unit 3 may be configured as a single image sensor that includes the reference pixel portion 36 and the effective pixel portion 35. In this case, since the reference pixel portion 36 and the effective pixel portion 35 are provided in the single image sensor, there is no problem due to an individual difference between the image sensors. Further, it is possible to reduce increase in the number of components of an imaging device.

Further, as shown in FIG. 3, in a case where the detection unit 3 is configured as the single image sensor that includes the reference pixel portion 36 and the effective pixel portion 35, it is preferable that the reference pixel portion 36 is positioned to be adjacent to the effective pixel portion 35. Since as a distance between the reference pixel portion 36 and the effective pixel portion 35 becomes larger, a difference between environmental temperatures thereof becomes larger (thermal environments become more similar to each other), the environmental temperatures of the reference pixel portion 36 and the effective pixel portion 35 are made close to each other. Thus, it is possible to make noise characteristics indicating distribution shapes of pixel signals between the effective pixel portion 35 and the reference pixel portion 36 similar to each other, which is advantageous for performing the variation correction process with high accuracy.

Further, as shown in FIG. 3, in a state where a detection surface of the first image sensor 31 is positioned on the imaging surface of the optical system 2 and a center C of the first image sensor 31 and an optical axis of the optical system 2 are set to match each other, the first image sensor 31 and the optical system 2 may be configured so that the diameter of an imaging region IR of the optical system is shorter than the length of the first image sensor 31 on at least one straight line that is included in the imaging surface and passes through the optical axis. In this case, the first image sensor 31 is configured so that infrared detection pixels that are positioned in the effective region AR that is a region that overlaps the imaging region IR form the effective pixel portion 35 as effective pixels and infrared detection pixels that are positioned in the reference region BR that is a region that does not overlap the imaging region IR form the reference pixel portion 36 as reference pixels. In this way, in a case where the reference pixel portion 36 is provided at a position where the imaging region IR is excluded, another component for avoiding incidence of infrared rays from the optical system 2 onto the reference pixel portion 36 is not necessary, and thus, it is possible to easily manufacture the detection unit 3 at low cost. Further, it is advantageous to provide the reference pixel portion 36 in a region where the imaging region IR is excluded while suitably securing the position and area of the effective pixel portion 35 with respect to the imaging region IR.

In the example of FIG. 3, the first image sensor 31 is a rectangular sensor, and four corners of the first image sensor 31 are used as the reference regions BR that are regions that do not overlap the imaging region IR. The reference pixel portion 36 may be selectively provided in an arbitrary shape at an arbitrary position in the reference regions BR. For example, while appropriately differentiating the diameter of the imaging region IR of the optical system with respect to the length of the first image sensor 31 on at least one straight line that is included in the imaging surface and passes through the optical axis, as described above, frame-shaped reference regions may be provided to surround the effective region, or reference regions may be provided in two edge portions that face each other with the center of the effective region being interposed therebetween. In this case, a frame-shaped reference pixel portion may be provided in the frame-shaped reference region, and a reference pixel portion may be provided in two edge portions that face each other with the center of the effective region being interposed therebetween. Position information of the effective pixel portion 35 and the reference pixel portion 36 is stored in the storage unit 8, and is appropriately referenced in the signal correction unit 6. In the first embodiment, the reference pixel portion 36 is provided in the lower right reference region BR in FIG. 3.

Returning to FIG. 2, as shown in FIG. 2, the signal correction unit 6 includes a selection unit 61 that selects the reference pixel portion 36 in the reference region BR and the effective pixel portion 35 in the effective region AR, a variation calculation unit 62 that calculates a reference variation value indicating a variation of pixel signals of a plurality of reference pixels included in the reference pixel portion 36, a correction intensity calculation unit 63 that calculates a correction intensity so that the correction intensity becomes larger as the reference variation value becomes larger, on the basis of the reference variation value, and a variation correction unit 64 that performs a variation reduction process of reducing variation in pixel signals of effective pixels as the reference variation value increases on the basis of the calculated correction intensity.

Figure 4A:
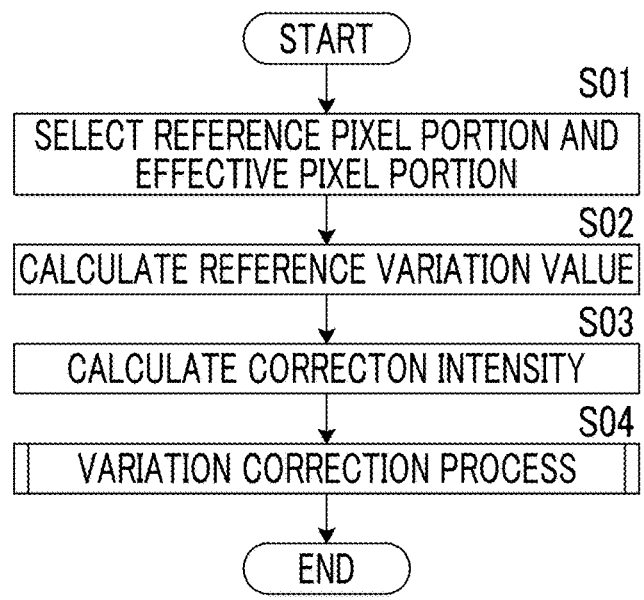
FIG. 4A is a flowchart showing a process in a signal correction unit according to the first embodiment.
Figure 4B:
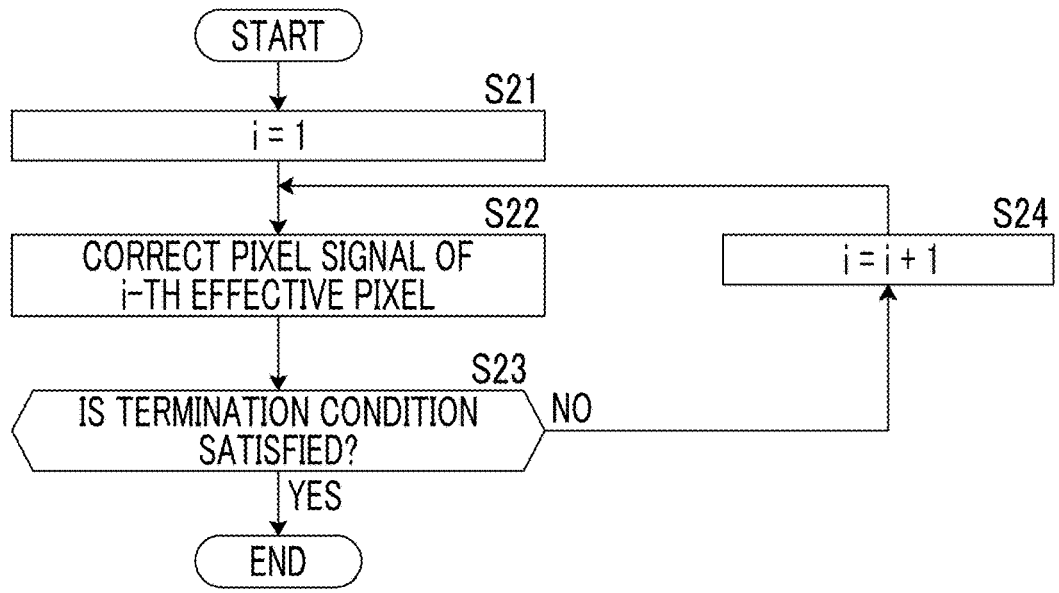
FIG. 4B is a flowchart showing a process in a variation correction unit according to the first embodiment.
Figure 5:
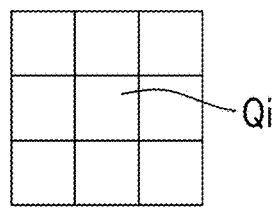
FIG. 5 is a diagram illustrating a variation correction process according to the first embodiment.

FIG. 4A is a flowchart illustrating a flow of processes of the signal correction unit 6, FIG. 4B is a flowchart illustrating processes of the variation correction unit 64 among the processes in FIG. 4A (process corresponding to S04 in FIG. 4A) in detail, and FIG. 5 is a diagram illustrating the variation correction process. Hereinafter, the signal correction unit 6 will be described in detail with reference to FIGS. 4A and 4B. Before the processes of the signal correction unit 6, it is assumed that image signals indicating an infrared image I detected by the first image sensor 31 are stored in the storage unit 8. The variation correction process includes a selection process, a variation calculation process, a correction intensity calculation process, and a variation reduction process according to the embodiment of the invention, as shown in the following steps S01 to S04, respectively.

First, the selection unit 61 selects a reference pixel portion 36 in a reference region BR and an effective pixel portion 35 in an effective region AR (S01) with reference to the storage unit 8. Here, the effective pixel portion 35 in the effective region AR in FIG. 3 and the reference pixel portion 36 that is disposed on the lower right side of the first image sensor 31 among the reference regions BR in FIG. 3 are selected.

Then, the variation calculation unit 62 calculates a dispersion of pixel signals of the reference pixel portion 36 using pixel signals of all reference pixels included in the reference pixel portion 36 in the reference region BR that is positioned on the lower right side of FIG. 3 as a reference variation value Kb (S02). Since there is no variation of pixel signals due to an imaging scene in the reference region BR onto which infrared rays from the optical system 2 are not incident, by calculating a reference variation value by the reference pixel portion 36 in the reference region BR, the reference variation value represents a variation of pixel signals due to noise.

Subsequently, the correction intensity calculation unit 63 calculates a correction intensity α for variation correction on the basis of the reference variation value Kb (S03). The correction intensity calculation unit 63 may calculate the correction intensity α by an arbitrary method so that the correction intensity α becomes larger as the reference variation value becomes larger, on the basis of the reference variation value. For example, the correction intensity α may be calculated according to a linear function or a specific function that defines a curve. Here, the correction intensity calculation unit 63 calculates the correction intensity according to the following Expression (1). In Expression (1), Kb represents a dispersion of pixel signals of the reference pixel portion 36, and Ks represents a standard variation value (here, a standard dispersion value) of pixel signals of the reference pixel portion 36. As Ks, a set value "2" is used. For example, the correction intensity calculation unit 63 calculates a correction intensity α=0.7 using Expression (1) if the calculated reference variation value Kb=4. According to Expression (1), it can be understood that, with respect to a case where the correction intensity α is a fixed value (for example, α=0.35), the correction intensity calculation unit 63 can calculate the correction intensity so that the correction intensity becomes larger as variation in pixel signals of an infrared image becomes larger. The numerical value 0.35 of the fixed number is an example, and a fixed number that is appropriately selected as necessary may be used.

$$\alpha = 0.35 * (Kb/Ks) \qquad (1)$$

The correction intensity α may be set as a value in a range of 0 to 1, and may be appropriately selected so that the correction intensity becomes larger as the reference variation value becomes larger. The correction intensity α is not limited to a method for using the ratio of the standard variation value as in Expression (1).

Subsequently, the variation correction unit 64 performs a variation reduction process of reducing a variation of image signals of the infrared image so that the correction intensity α becomes larger as a variation of image signals of an infrared image becomes larger (S04). The flow of the processes of the variation correction unit 64 will be described with reference to FIG. 4B. Here, the variation correction unit 64 corrects, with respect to a pixel signal of each effective pixel, the pixel signal of the effective pixel so that a difference between the value of the pixel signal of the effective pixel and an average value of pixel signals of a plurality of peripheral pixels that are positioned in the vicinity of the effective pixel becomes smaller as the correction intensity α becomes larger, to thereby perform the variation reduction process.

The variation correction unit 64 sets an "i" indicating a pixel number as an initial value (i=1) (S21), selects an i-th pixel signal, and performs correction of the pixel signal using the following Expression (2) (S22).

$$Aip = Ai * (1-\alpha) + Mi * \alpha \qquad (2)$$

In Expression (2), Ai represents a value of a pixel signal of an i-th effective pixel (i is a natural number of 1 to n) of the effective pixel portion 35, Aip represents a value of a pixel signal after correction of the i-th effective pixel, Mi represents an average value of peripheral pixels around the i-th effective pixel, and α represents a correction intensity. Here, the correction intensity α is a value calculated on the basis of Expression (1) by the correction intensity calculation unit 63. Further, as shown in FIG. 5, the variation correction unit 64 uses eight effective pixels other than an effective pixel Qi, which are positioned in a range of 3×3 pixels around each i-th effective pixel Qi, as respective peripheral pixels, and uses an addition average value of pixel signals of the eight peripheral pixels as an average value Mi of the pixel signals of the peripheral pixels.

Subsequently, the variation correction unit 64 determines whether a termination condition (i=n) is satisfied. In a case where the termination condition is not satisfied (i!=n) (S23, NO), the variation correction unit 64 increases i indicating the pixel number by 1 (S24), and performs the process of S22 with respect to the next effective pixel. Further, the variation correction unit 64 repeats the processes of S22 to S24 until the termination condition is satisfied (i=n), and then, terminates the variation reduction process.

As described above, in a case where the variation correction process is performed so that as the reference variation value becomes larger, the correction intensity $\alpha$ becomes larger, by performing the variation correction process using a suitable correction intensity based on a noise characteristic indicating a distribution of pixel signals of each infrared image, even in a case where a variation of the pixel signals of the infrared image is changed, it is possible to suitably reduce noise due to a variation of the pixel signals. Further, as shown in Expression (1), in a case where the correction intensity is determined so that the correction intensity $\alpha$ is increased in accordance with the ratio of a reference variation value to a standard variation value, it is possible to easily and suitably calculate the correction intensity. Further, as shown in Expression (2), in a case where the variation correction process is performed so that as the reference variation value becomes larger, a difference between a value of a pixel signal of each effective pixel and an average value of pixel signals of its peripheral pixels becomes smaller to enhance a smoothing effect, it is possible to suitably reduce a variation of the pixel signals of the infrared image.

A corrected image that is an infrared image after correction subjected to the variation correction process is stored in the storage unit 8, is appropriately output to an external storage unit, a display unit (which are not shown), and the like by the output unit 7, and is displayed on the display unit as necessary. Further, the corrected image may be appropriately subjected to other necessary correction processes before or after the variation correction process, in a digital signal processing device of the infrared imaging device 1.

It is preferable that the signal correction unit 6 performs a correction intensity updating process of calculating a reference variation value, and updating and calculating a correction intensity in accordance with the calculated reference variation value. In a case where a plurality of infrared images are captured, the signal correction unit 6 may perform the correction intensity updating process (processes shown in S01 to S03 in FIG. 4A) with respect to each of respective infrared images that are captured secondly and thereafter in a time-series order to update the correction intensity each time, and then, may perform the variation reduction process (process shown in S04 in FIG. 4A). Alternatively, the signal correction unit 6 may perform the correction intensity updating process at intervals, and may perform the variation reduction process (process shown in S04 in FIG. 4A) with respect to each of the respective infrared images that are captured secondly and thereafter in the time-series order using in common the correction intensity calculated by the previous correction intensity updating process. Here, the correction intensity updating process is configured by the same processes as the selection process, the reference variation value calculation process, and the correction intensity calculation process (processes corresponding to S01 to S03 shown in FIG. 4A, respectively). In this case, by updating the correction intensity to dynamically perform the variation correction process, it is possible to suitably handle fluctuation of a variation of pixel signals that are nonlinearly changed in time series, to thereby perform the variation correction process with high accuracy.

In a case where the infrared imaging device 1 performs imaging of a motion picture, in the signal correction unit 6, it is preferable that the variation calculation unit 62 periodically repeats the variation correction process including the correction intensity updating process on each frame image. Further, in a case where the signal correction unit 6 performs the correction intensity updating process at intervals, the signal correction unit 6 may set the intervals to regular intervals or different intervals. The intervals at which the correction intensity updating process is performed may be appropriately set according to fluctuation of infrared rays that are incident onto the first image sensor 31. For example, it may be considered that, in a case where the intensity of infrared rays is frequently changed due to external factors irrespective of imaging targets, such as a substrate temperature (particularly, a sensor temperature), a casing temperature of an infrared imaging device, or the like, the intervals are set to be short, and in a case where the change of the intensity of infrared rays due to external factors is not so large, the intervals are set to be long. For example, the intervals at which the correction intensity updating process is performed may be set to 0.01 seconds or longer and 300 seconds or shorter, and further, may be set to 0.01 seconds or longer and 180 seconds or shorter.

The signal correction unit 6 may perform the correction intensity updating process according to fluctuation of infrared rays that are incident onto the reference pixel portion 36. For example, the signal correction unit 6 may acquire a pixel signal of the reference pixel portion 36, and in a case where a difference between the acquired pixel signal of the reference pixel portion 36 and a pixel signal of the reference pixel portion 36 in the previous correction intensity calculation process satisfies a second threshold value condition, the signal correction unit 6 may perform the correction intensity updating process. For example, as a second threshold value, the amount of change of a pixel signal of a reference pixel in a case where a sensor temperature is changed by a specific temperature (for example, 0.1° C.) may be set on the basis of a measurement value that is experimentally measured in advance. Since the pixel signal of the reference pixel portion 36 represents the intensity of incident infrared rays based on external factors, for example, in a case where a temperature difference between sensor temperatures at a point of time ta and a point of time tb becomes larger, a difference (the amount of change) between a pixel signal of the reference pixel portion 36 at the point of time ta and a pixel signal of the reference pixel at the point of time tb (!=ta) also becomes larger.

In the above-mentioned case, in a case where the difference between the pixel signal of the reference pixel portion 36 and the pixel signal of the reference pixel portion 36 in the previous correction intensity calculation process is equal to or smaller than the second threshold value (in a case where the second threshold value condition is not satisfied), the signal correction unit 6 does not perform the correction intensity updating process. On the other hand, in a case where the difference between the pixel signal of the reference pixel portion 36 and the pixel signal of the reference pixel portion 36 in the previous correction intensity calculation process is larger than the second threshold value (in a case where the second threshold value condition is satisfied), the signal correction unit 6 performs the correction intensity updating process. Thus, it is possible to update the correction intensity according to fluctuation of infrared rays that are incident onto the first image sensor 31, and to perform the variation correction process at an appropriate correction intensity. As the second threshold value of the second threshold value condition, an appropriate amount of change of a pixel signal that affects a noise characteristic (particularly, a variation of pixel signals) may be set. For example, here, since the second threshold value is determined in association with the temperature change of the sensor temperature, it is possible to reflect the appropriate amount of change of the pixel signal that affects the noise characteristic (particularly, a variation of pixel signals). The temperature change of the sensor temperature corresponding to the second threshold value is set to 0.1° C., but for example, may be set to an appropriate value that is equal to or greater than 0.01° C. Further, it is sufficient if the pixel signal of the reference pixel portion 36 represents a representative pixel signal of the reference pixel portion 36, and thus, may be an average value of the pixel signals of the reference pixels included in the reference pixel portion 36, an intermediate value thereof, or the like, for example.

Figure 1:
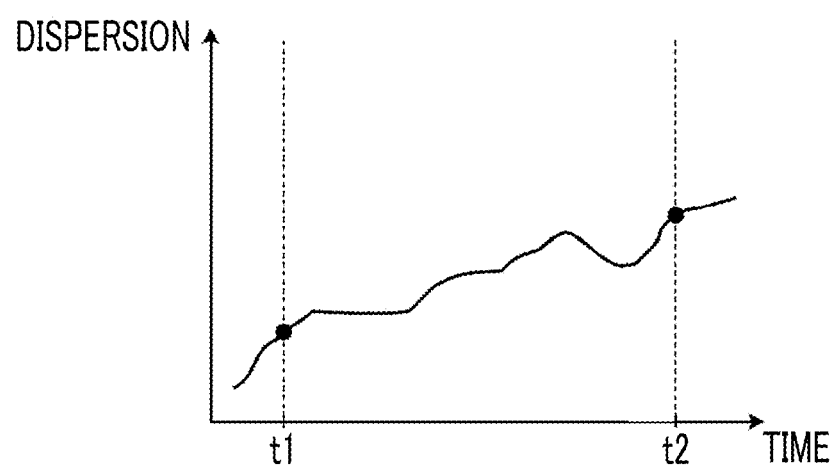
FIG. 1 is a time-series graph of a dispersion of pixel signals of an infrared image detected by an image sensor.
Figure 6:
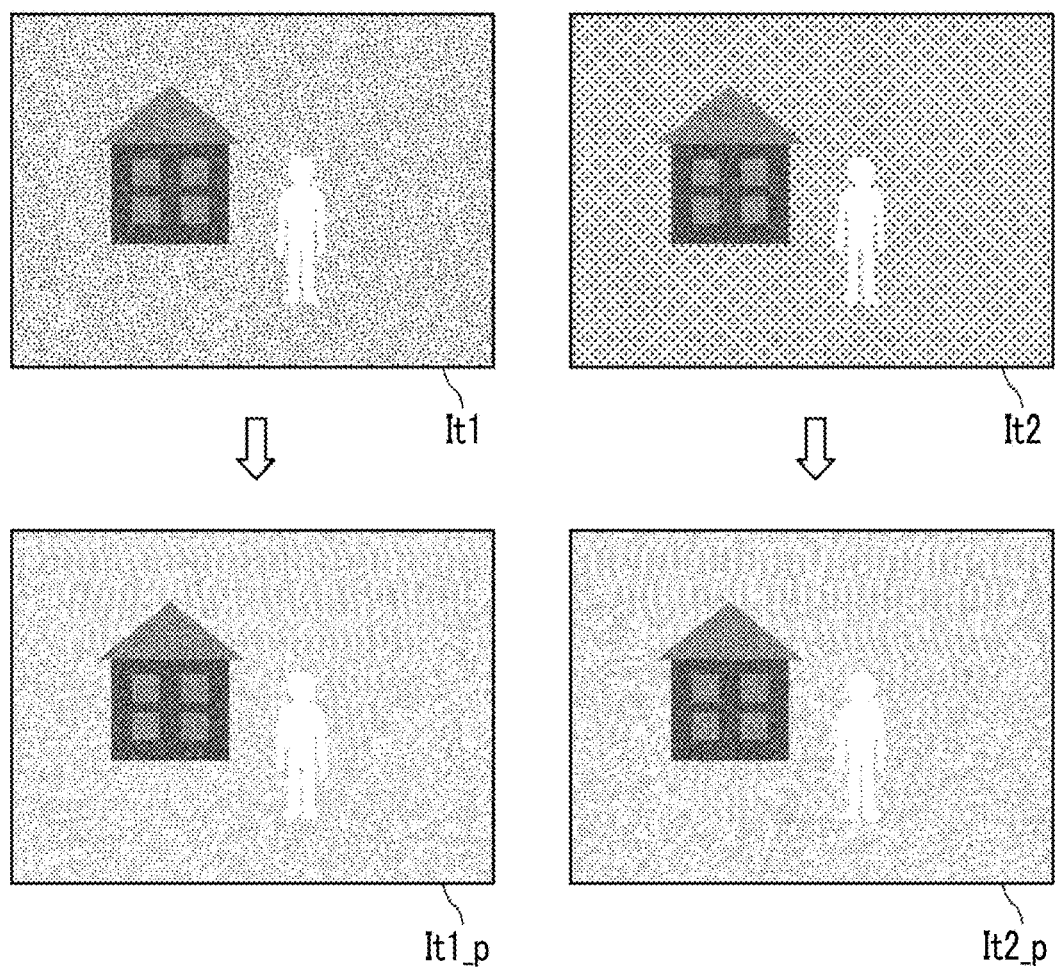
FIG. 6 is a diagram showing an infrared image before correction and an infrared image after correction according to the first embodiment.

FIG. 6 shows a corrected image It1_$p$ and a corrected image It2_$p$ obtained by correcting a variation of pixel signals with respect to an infrared image It1 at a point of time t1 in FIG. 1 and an infrared image It2 at a point of time t2 in FIG. 1 using the variation correction process according to the first embodiment, respectively.

According to the embodiment of the invention, by executing the variation correction process using an appropriate correction intensity based on a noise characteristic of each image, even in a case where a variation of pixel signals of an infrared image is changed, it is possible to suitably reduce noise due to a variation of the pixel signals. As a result, as shown in FIG. 6, even in a case where the infrared image It2 has a relatively large variation of pixel signals compared with the infrared image It1, it is possible to suitably reduce noise due to a variation of pixel signals of the corrected image It1_$p$ and the corrected image It2_$p$, and thus, it is possible to provide a corrected image obtained by uniformizing image qualities of images after correction of respective images under various environments.

Hereinafter, modification examples of the detection unit 3 and the signal correction unit 6 are respectively shown in second to fifth embodiments. Processes of the detection unit 3 and the signal correction unit 6 in the second embodiment will be described with reference to FIG. 3. In the respective embodiments, the same reference numerals are given to the same configurations as in the first embodiment, and description thereof will not be repeated.

The second embodiment is different from the first embodiment in that the reference pixel portion 36 includes a plurality of partial reference pixel portions 36A to 36D and the signal correction unit 6 performs a variation correction process using image signals of the plurality of partial reference pixel portions 36A to 36D. Hereinafter, points different from the first embodiment with respect to the processes of the detection unit 3 and the signal correction unit 6 will be mainly described, and description of other common points will not be repeated.

As shown in FIG. 3, the reference pixel portion 36 includes the partial reference pixel portions 36A to 36D that are provided in respective reference regions BR at four corners of the first image sensor 31 that is a rectangular sensor. The partial reference pixel portions that form the reference pixel portion 36 may be formed in an arbitrary number and in an arbitrary shape. For example, the reference pixel portion 36 may be formed by an arbitrary combination selected from the partial reference pixel portions 36A to 36D shown in FIG. 3.

As shown in FIG. 3, in a case where the reference pixel portion 36 is formed by the plurality of partial reference pixel portions 36A to 36D that are positioned to be adjacent to the effective pixel portion 35, by reflecting pixel signals of the partial reference pixel portions 36A to 36D at different positions, it is possible to suitably make noise characteristics indicating distribution shapes of pixel signals between the effective pixel portion 35 and the reference pixel portion 36 similar to each other, which is advantageous for performing the variation correction process with high accuracy.

Further, as shown in FIG. 3, the reference pixel portion 36 includes first and second partial reference pixel portions 36A and 36D that face each other with the center C of the effective region AR being interposed therebetween in a first direction, and third and fourth partial reference pixel portions 36B and 36C that face each other with the center C of the effective region C being interposed therebetween in a second direction different from the first direction. Thus, by suitably arranging the partial reference pixel portions 36A to 36D, it is possible to more suitably make noise characteristics indicating distribution shapes of pixel signals between the effective pixel portion 35 and the reference pixel portion 36 similar to each other, which is advantageous for performing the variation correction process with high accuracy.

As in the second embodiment, processes of the signal correction unit 6 in a case where the reference pixel portion 36 includes the plurality of partial reference pixel portions 36A to 36D will be described.

The selection unit 61 selects respective partial reference pixel portions with reference to the storage unit 8. Here, the partial reference pixel portions 36A to 36D are selected. In a case where the number, shape, or the like of the partial reference pixel portions varies, the selection unit 61 may appropriately select suitable partial reference pixel portions. Further, the variation calculation unit 62 calculates, with respect to each of the plurality of selected partial reference pixel portions (here, the partial reference pixel portions 36A to 36D), a partial reference variation value indicating a variation of pixel signals of the partial reference pixel portion, and determines a reference variation value on the basis of the plurality of calculated partial reference variation values.

Here, the variation calculation unit 62 calculates a dispersion of pixel signals of all reference pixels included in each of the partial reference pixel portions 36A to 36D as a partial reference variation value, with respect to each of the partial reference pixel portions 36A to 36D. As the partial reference variation value, for example, a value indicating a statistical variation such as a dispersion or a standard deviation of pixel signals included in each of the partial reference pixel portions 36A to 36D, a value indicating the width of a distribution of pixel signals such as a difference between a maximum value and a minimum value of pixel signals included in each of the partial reference pixel portions 36A to 36D, or the like, may be used. Then, the variation calculation unit 62 determines an average value of the plurality of partial reference variation values as a reference variation value.

Then, the correction intensity calculation unit 63 calculates a correction intensity α using Expression (1), in a similar way to the first embodiment, on the basis of the determined reference variation value. Further, the variation correction unit 64 may perform the variation correction process using Expression (2), in a similar way to the first embodiment, using the calculated correction intensity.

In a case where the variation calculation unit 62 determines the average value of the plurality of partial reference variation values as the reference variation value, it is possible to reduce shortage of correction and excessive correction on the basis of the correction intensity in which the plurality of partial reference variation values are reflected, to thereby provide a corrected image subjected to the variation correction process with high accuracy.

The variation calculation unit 62 may determine the maximum value or the minimum value of the plurality of partial reference variation values as the reference variation value. In a case where the variation calculation unit 62 determines the maximum value of the plurality of partial reference variation values as the reference variation value, by setting the correction intensity according to a variation of pixel signals of a partial reference pixel portion in which a variation of the pixel signals is maximum to perform the variation correction process, it is possible to provide a corrected image in which reduction of noise due to a variation of pixel signals is preferentially performed. Further, in a case where the variation calculation unit 62 determines the minimum value of the plurality of partial reference variation values as the reference variation value, by setting the correction intensity according to a variation of pixel signals of a partial reference pixel portion in which a variation of the pixel signals is minimum to perform the variation correction process, it is possible to provide a corrected image in which noise due to a variation is reduced, while securing visibility of details of an infrared image.

Further, the correction intensity calculation unit 63 may determine the correction intensity α on the basis of an upper limit value or a lower limit value stored in the storage unit 8. In this case, the correction intensity calculation unit 63 determines, in a case where a candidate value of the correction intensity α calculated according to the reference variation value as shown in Conditional Expression (1) is larger than the upper limit value, the upper limit value as the correction intensity α, and determines, in a case where the candidate value of the correction intensity α calculated according to the reference variation value is smaller than the lower limit value, the lower limit value as the correction intensity α. In this case, by limiting the correction intensity, it is possible to perform the variation correction process. The correction intensity calculation unit 63 may determine the correction intensity α on the basis of only one of the upper limit value and the lower limit value.

Figure 7:
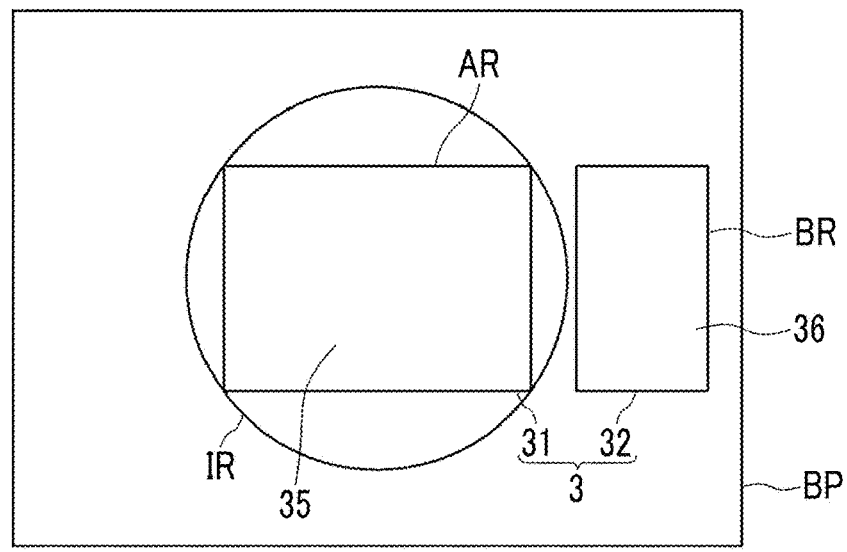
FIG. 7 is a schematic view showing a detection unit according to a third embodiment.
Figure 8:
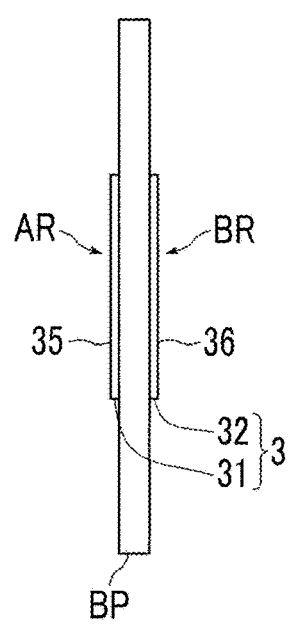
FIG. 8 is a schematic view showing a detection unit according to a fourth embodiment.
Figure 9:
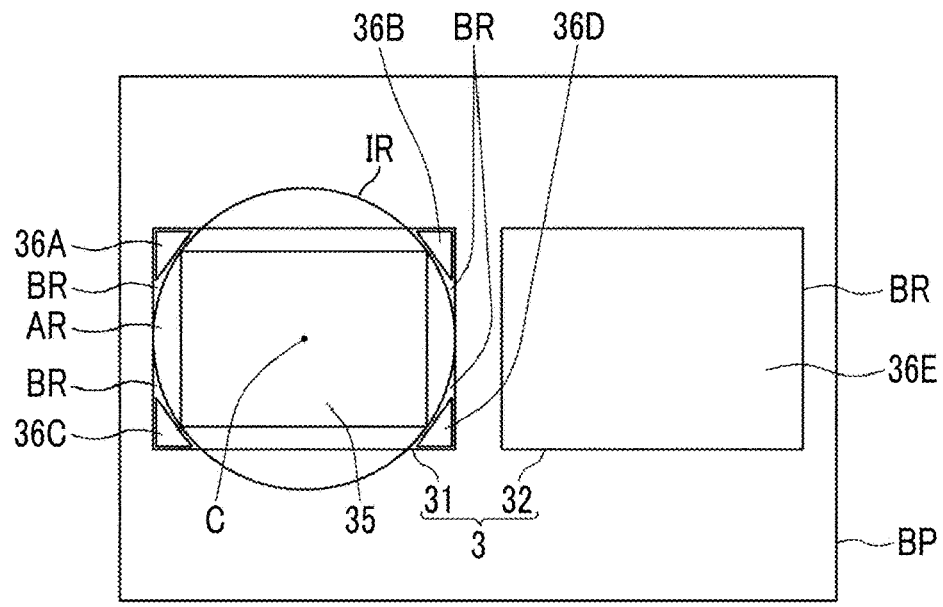
FIG. 9 is a schematic view showing a detection unit according to a fifth embodiment.

FIG. 7 is a schematic diagram showing a detection unit 3 according to a third embodiment. FIG. 8 is a schematic view showing a detection unit 3 according to a fourth embodiment. FIG. 9 is a schematic view showing a detection unit 3 according to a fifth embodiment. The third to fifth embodiments are different from the first embodiment in a configuration of the detection unit 3 and a variation correction process in the signal correction unit 6. Particularly, the third to fifth embodiments are different from the first embodiment in that the detection unit 3 includes a second image sensor 32. Hereinafter, the second image sensor 32 that is a common feature in the third to fifth embodiments will be first described. Then, in the third to fourth embodiments, different points from the first embodiment with respect to the configuration of the detection unit 3 and processes of the signal correction unit 6 will be mainly described, and description of other common points will not be repeated. Since the fifth embodiment is a modification example of the second embodiment, different points from the second embodiment will be mainly described, and description of other common points with respect to the second embodiment will not be repeated.

In the third to fifth embodiments, the detection unit 3 includes a first image sensor 31 having effective pixel portions, and the second image sensor 32 that has the same temperature characteristic as that of the first image sensor 31 and has reference pixel portions, and the second image sensor 32 is positioned in the vicinity of the first image sensor 31. Thus, it is possible to easily confirm the area of the effective region AR with respect to the area of the imaging region IR while securing the reference pixel portion 36, and thus, it is advantageous for achieving high resolution of an infrared image. One second image sensor 32 may be provided, or a plurality of second image sensors 32 may be provided.

The second image sensor 32 includes infrared imaging elements having the same structure as that of infrared imaging elements of the first image sensor 31, and is configured so that the second image sensor shows fluctuation of the same pixel signals as in the first image sensor under a thermal environment that external temperatures such as a substrate temperature (particularly, a sensor temperature) and a casing temperature of the infrared imaging device are equivalent to each other. Further, the second image sensor 32 may be positioned in a range where a temperature difference of than 1° C. or greater does not occur between an environmental temperature of the second image sensor 32 and an environmental temperature of the first image sensor 31, or in a range where the shortest distance from the second image sensor 32 to the first image sensor 31 is within 50% of a sensor length of the first image sensor 31. In this case, as the sensor length of the first image sensor 31, for example, the length of arbitrary one side of the first image sensor 31, a diagonal length of the sensor, and a maximum value of the length of a segment that crosses the first image sensor 31 through the center of the sensor, or the like may be used. Further, as the environmental temperature of the second image sensor, an environmental temperature at a specific position of the second image sensor, such as the center of the sensor, may be used. Similarly, as the environmental temperature of the first image sensor, an environmental temperature at a specific position of the second image sensor, such as the center of the sensor, may be used.

The third embodiment shows an example in which the second image sensor 32 is positioned in the vicinity of the first image sensor 31, as shown in FIG. 7, in which the first image sensor 31 and the second image sensor 32 are provided to be adjacent to a first surface (surface close to the optical system 2) of a substrate BP. In this case, it is possible to make influences of external temperatures such as a substrate temperature (particularly, a sensor temperature) and a casing temperature of the infrared imaging device 1 equivalent to each other in the first image sensor 31 and the second image sensor 32, and thus, it is possible to perform the variation correction process with high accuracy.

The fourth embodiment shows an example in which the second image sensor 32 is positioned in the vicinity of the first image sensor 31, as shown in FIG. 8, in which the first image sensor 31 is provided on a first surface of the substrate BP and the second image sensor 32 is provided on a second surface (surface distant from the optical system 2) of the substrate BP. By providing the second image sensor 32 and the first image sensor 31 at positions corresponding to the first surface and the second surface of the substrate BP, even in a case where temperature irregularities occur in a direction orthogonal to an optical axis, by using a reference variation value of the reference pixel portion 36 at a position corresponding to the second image sensor 32 with respect to the effective pixel portion 35 of the first image sensor 31, it is possible to reduce the influence of the temperature irregularities, to thereby perform the variation correction process with high accuracy. In the fourth embodiment, in a case where the second image sensor 32 is formed to have a size corresponding to the first image sensor 31, it is possible to enhance the above-mentioned effects. As shown in the third embodiment, the second image sensor 32 may be configured so that the area of a detection surface thereof is smaller than that of the first image sensor 31 (see FIG. 7), or may be configured so that the area of the detection surface is larger than that of the first image sensor 31. Further, the substrate BP may be appropriately formed of a substance having a thermal conductivity necessary in each embodiment.

Further, the detection unit 3 in the third and fourth embodiments is provided with the reference pixel portion 36 on the entire detection surface of the second image sensor 32, as shown in FIGS. 7 and 8.

The signal correction unit 6 in the third and fourth embodiments performs the same variation correction process as in the first embodiment, except that the position of the reference pixel portion 36 is different therefrom. That is, the signal correction unit 6 in the third and fourth embodiments is configured so that the selection unit 61 selects each corresponding reference pixel portion 36, the variation calculation unit 62 calculates a reference variation value indicating a variation of pixel signals of all reference pixels of the reference pixel portion 36, the correction intensity calculation unit 63 calculates a correction intensity using Expression (1) in a similar way to the first embodiment, and the variation correction unit 64 performs a variation correction process using Expression (2) in a similar way to the first embodiment.

In a case where the reference pixel portion 36 is provided on the entire detection surface of the second image sensor 32, by reflecting pixel signals of all reference pixels of the second image sensor 32, for example, it is possible to also reflect a variation of pixel signals at a central portion of the second image sensor 32, and to reduce the influence of fluctuation of a reference pixel characteristic due to pixel positions to thereby perform the variation correction process with high accuracy.

Further, as in the detection unit 3 in the third and fourth embodiment, in a case where the reference pixel portion 36 is provided only in the second image sensor, it is possible to enhance the degree of freedom in design of the effective pixel portion 35 in the first image sensor 31. For example, as shown in FIGS. 7 and 8, it is possible to configure the effective pixel portion 35 so that the entire detection surface of the first image sensor 31 is included in the imaging region IR, and thus, it is possible to suitably secure the area of the effective pixel portion 35.

The fifth embodiment is an example in which the detection unit 3 includes the first image sensor 31 and the second image sensor 32 that are same as in the second embodiment and the reference pixel portion 36 includes partial reference pixel portions 36A to 36D that are provided in the first image sensor 31 and a partial reference pixel portion 36E that is provided in the second image sensor 32, as shown in FIG. 9. As shown in FIG. 9, the first image sensor 31 in the fifth embodiment has the same configuration as in the first image sensor 31 in the second embodiment. Further, the second image sensor 32 in the fifth embodiment includes the partial reference pixel portion 36E on the entire detection surface.

Further, the signal correction unit 6 in the fifth embodiment performs the same variation correction process as in the second embodiment, except that the partial reference pixel portions 36A to 36E are used since the partial reference pixel portion 36E is additionally provided in the reference pixel portion 36. That is, the signal correction unit 6 in the fifth embodiment is configured so that the selection unit 61 selects the partial reference pixel portions 36A to 36E. Further, the variation calculation unit 62 calculates a dispersion as a partial reference variation value with respect to each of the partial reference pixel portions 36A to 36E, and determines an average value of the calculated partial reference variation values as a reference variation value. Then, the correction intensity calculation unit 63 calculates a correction intensity on the basis of Expression (1) in a similar way to the second embodiment, and the variation correction unit 64 performs a variation correction process using Expression (2) in a similar way to the second embodiment.

Further, the variation calculation unit 62 in the fifth embodiment may determine a minimum value or a maximum value of a plurality of partial reference variation values as a reference variation value, in a similar way to the second embodiment. As shown in the fifth embodiment, by determining the reference variation value using pixel signals of each of the partial reference pixel portions 36A to 36E of the first image sensor 31 and the second image sensor 32, it is possible to more suitably make noise characteristics indicating distribution shapes of pixel signals between the effective pixel portion 35 and the reference pixel portion 36 similar to each other, which is advantageous for performing the variation correction process with high accuracy. Further, in a case where any one of the average value, the minimum value, and the maximum value of the pixel signals of each of the partial reference pixel portions 36A to 36E of the first image sensor 31 and the second image sensor 32 is determined as a reference variation value, it is possible to further enhance respective effects when the average value, the minimum value, and the maximum value of the plurality of partial reference variation values are determined as the reference variation value, as described in the second embodiment.

Figure 10A:
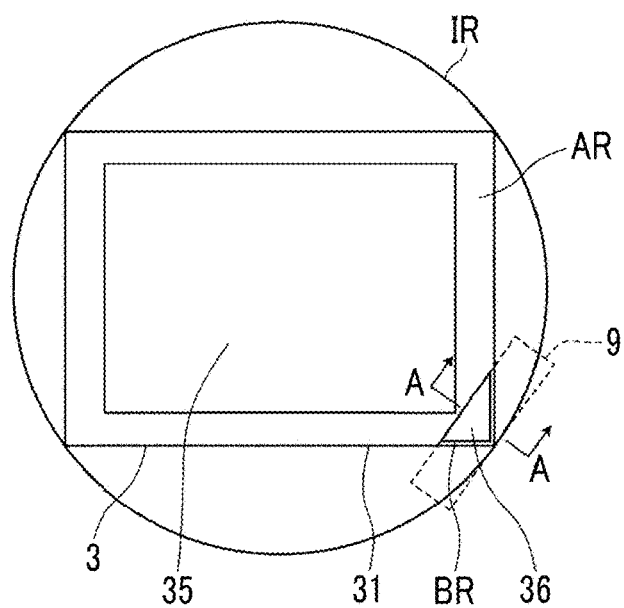
FIG. 10A is a schematic view showing a detection unit according to a sixth embodiment.

Hereinafter, as a sixth embodiment, an example in which the infrared imaging device 1 further includes a shield unit 9 that shields incidence of infrared rays onto a reference pixel from the optical system 2 will be described with reference to FIGS. 10A and 10B. FIG. 10A is a schematic view showing a detection unit 3 according to the sixth embodiment. FIG. 10B is a sectional view of a cut portion, showing an AA section in FIG. 10A. Since the sixth embodiment is different from the variation correction unit 64 in the first embodiment only in that the detection unit 3 includes the shield unit 9 and incidence of infrared rays is shielded by the shield unit 9 so that the reference region BR is provided and configurations or functions of other respective units are the same as in the first embodiment, the shield unit 9 will be described, and description of other common portions will not be repeated.

In the sixth embodiment, as shown in FIGS. 10A and 10B, the shield unit 9 is provided between a detection surface of the first image sensor 31 and the optical system 2, and an effective region AR where infrared rays are incident and a reference region BR that is a region onto which infrared rays are not incident are provided in the first image sensor 31 by shielding a part of infrared rays incident onto an imaging region IR from the optical system 2 using the shield unit 9. Further, an effective pixel portion 35 is provided in the effective region AR, and a reference pixel portion 36 is provided in the reference region BR.

According to the sixth embodiment, by appropriately selecting a position or a shape in a range where the effective pixel portion 35 can be appropriately secured to provide the shield unit 9, it is possible to differentiate the position or the shape of the reference pixel portion 36, and thus, it is possible to enhance the degree of freedom in design of the infrared imaging device 1 while securing the effective pixel portion 35. Further, the shield unit 9 may have an arbitrary configuration capable of securing a necessary reference region, and as an example, the shield unit 9 may be configured to include a support portion 9B that is erectly provided on the substrate BP and a shield plate 9A that extends in a direction close to an optical axis from the support portion 9B, as shown in FIG. 10B. In this way, in a case where the shield unit 9 has a simple configuration, it is advantageous for enhancing the degree of freedom in design and achieving low cost. Further, a reference region may be designed at an arbitrary position and in an arbitrary shape using the shield unit 9, and a reference region exemplified in each embodiment may be provided using the shield unit 9. Here, there is a case where a contour of a region corresponding to the shield unit 9 becomes blurred in a detection region according to a distance between the shield unit 9 and a detection surface. In this case, a configuration in which test imaging is performed so that an image of a reference subject having a uniform temperature appears in an entire imaging region to acquire pixel signals of infrared detection elements of a detection region, a region for which it is considered that the infrared detection elements represent the intensity of infrared rays based on the reference subject in the detection region is determined as an effective region, through determination using an appropriate threshold value, for example, and a region for which it is considered that there is no contribution of the intensity of infrared rays of the reference subject in the infrared detection elements is determined as a reference region, may be used.

As a seventh embodiment, a modification example of the variation reduction process in the variation correction unit 64 is shown. The seventh embodiment is different from the first embodiment only in that the variation correction unit 64 uses Expression (3) (which will be described later) instead of Expression (2), and configurations or functions of other respective units are the same as in the first embodiment. Thus, processes relating to Expression (3) in the variation correction unit 64 will be described, and description of other common portions will not be repeated.

FIG. 11 is a diagram showing an infrared image before correction and an infrared image after correction according to the seventh embodiment. In an infrared image It before correction shown in FIG. 11, noise is generated due to a variation of pixel signals, and the intensity of infrared rays is reduced at a position spaced from an optical axis of an infrared image, and thus, pixel signals are reduced at the position spaced from the optical axis of the infrared image. The phenomenon that the intensity of infrared rays is reduced at the position spaced from the optical axis of the infrared image corresponds to a so-called peripheral light intensity reduction phenomenon at a visible light imaging device.

In the seventh embodiment, the variation correction unit 64 performs a variation correction process with respect to each of first to n-th effective pixels included in the effective pixel portion 35 using the following Expression (3) instead of Expression (2). Expression (3) is an expression for regulating both correction of fluctuation in pixel signals (hereinafter, referred to as peripheral fluctuation correction) due to reduction of the intensity of infrared rays at a position spaced from an optical axis of an infrared image and variation correction.

$$Aip = Ai*(1-\alpha*\beta) + Mi*\alpha*\beta \qquad (3)$$

In Expression (3), similar to Expression (2), Ai represents a value of a pixel signal of an i-th effective pixel (i is a natural number of 1 to n) of the effective pixel portion 35, Aip represents a value of a pixel signal after correction in the i-th effective pixel, Mi represents an average value of peripheral pixels around the i-th effective pixel, and $\alpha$ represents a correction intensity. Further, in Expression (3), $\beta$ is a parameter used for peripheral fluctuation correction. $\beta$ is changed in a range of $\beta >= 1$ and $\alpha*\beta <= 1$, and is set to increase a pixel signal with respect to a set position of an infrared image. For example, $\beta$ is set to 1 in a case where a distance from the center of an infrared image of the i-th effective pixel is equal to or greater than a specific distance, and is set to a value that is equal to or larger than 1, which increases according to the distance from the center of the infrared image of the i-th effective pixel, in a case where the distance from the center of the infrared image of the i-th effective pixel is equal to or greater than the specific distance.

According to the seventh embodiment, the variation correction unit 64 can provide an infrared image after correction It_p in which noise due to a variation of pixel signals is corrected and reduction in pixel signals at a position spaced from an optical axis of an infrared image is suitably corrected on the basis of the correction intensity $\alpha$, as shown in FIG. 11. The invention is not limited to Expression (2) and Expression (3), and the variation correction unit 64 may employ an arbitrary variation correction process suitable for the infrared imaging device 1 as long as it is capable of reducing a variation of image signals of an infrared image so that the level of reduction of a variation of the image signals of the infrared image becomes larger as the correction intensity becomes larger. In other respective embodiments of the invention, similarly, Expression (3) shown in the seventh embodiment instead of Expression (2) may be employed.

Figure 12:
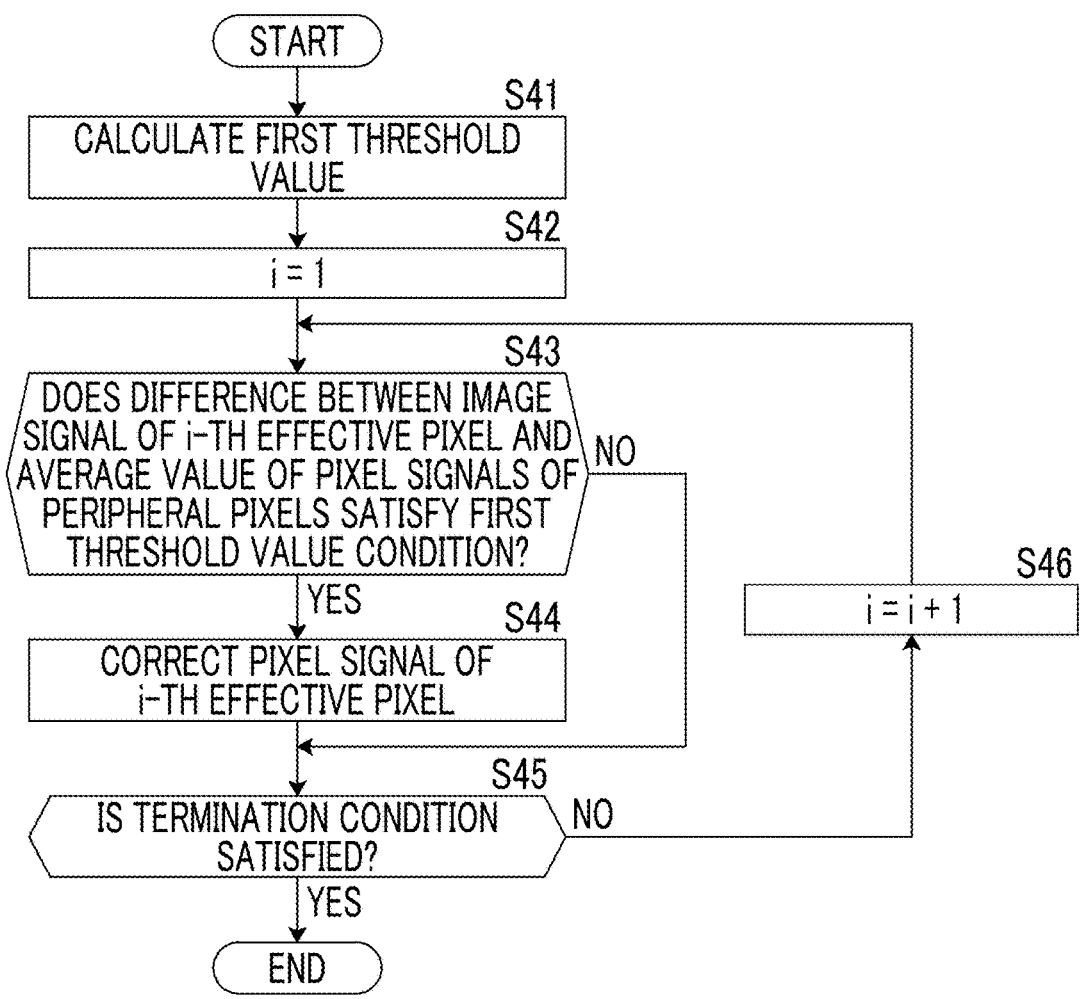
FIG. 12 is a flowchart showing a process in a variation correction unit according to an eighth embodiment.
Figure 13:
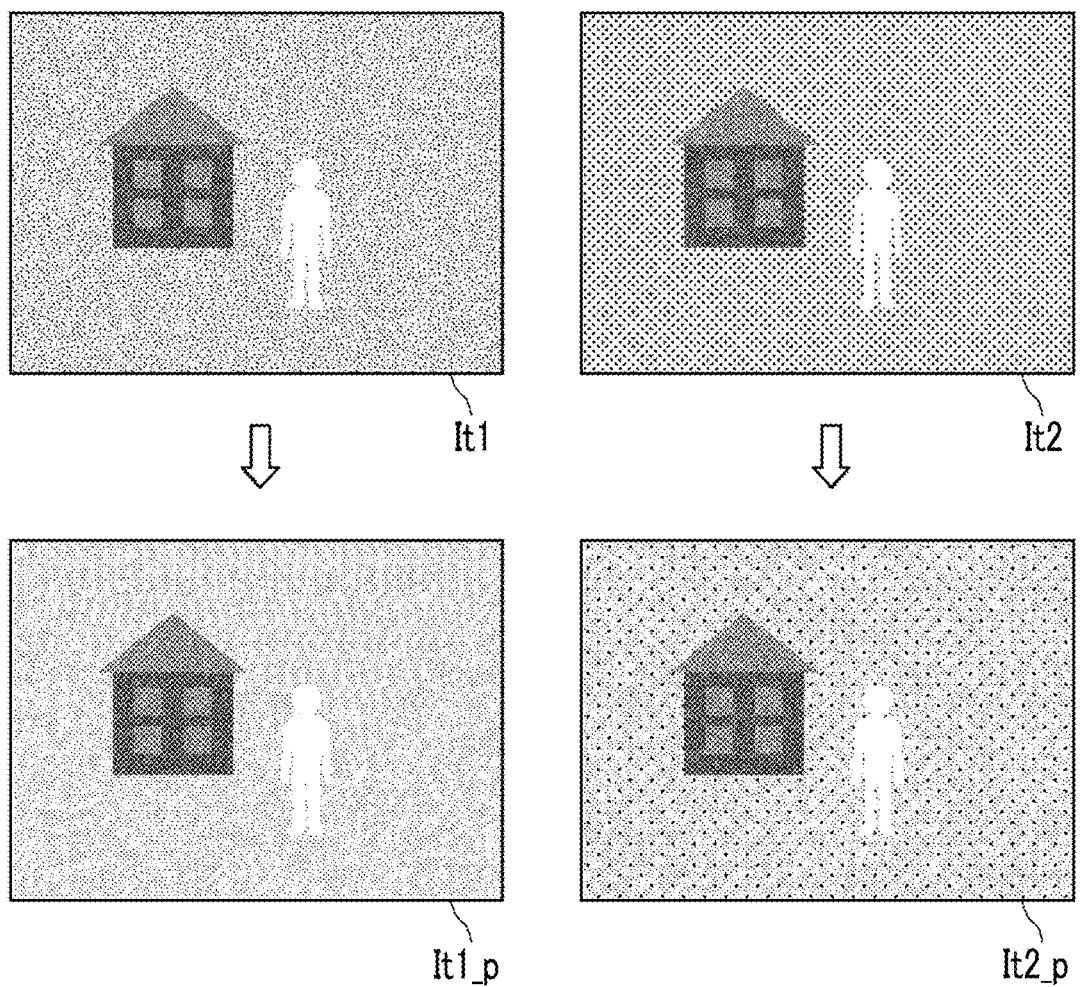
FIG. 13 is a diagram showing a comparative example of an infrared image before correction and an infrared image after correction.

As an eighth embodiment, an example of a variation correction process of selectively correcting pixel signals with respect to effective pixels included in the effective pixel portion 35 in the variation correction unit 64 is shown. FIG. 12 is a flowchart showing a process in the variation correction unit 64 according to the eighth embodiment.

In the eighth embodiment, the variation correction unit 64 performs a variation correction process as shown in Expression (1) in a case where a difference between a value of a pixel signal of an effective pixel and an average value of pixel signals of a plurality of peripheral pixels that are positioned in the vicinity of the effective pixel satisfies a first threshold value condition. The eighth embodiment is different from the first embodiment only in that processes of the variation correction unit 64 is different from those of the variation correction unit 64 of the first embodiment, and configurations or functions of other respective units are the same as in the first embodiment. Thus, the processes of the variation correction unit 64 will be described with reference to FIG. 12, and description of other common portions will not be repeated.

In the eighth embodiment, subsequently to the selection process, the reference variation value calculation process, and the correction intensity calculation process (processes corresponding to S01 to S03 shown in FIG. 4A), the variation correction unit 64 calculates a first threshold value for determining the presence and absence of occurrence of noise (S41). Here, the variation correction unit 64 calculates a standard deviation $\sigma$ of pixel signals of all effective pixels included in the effective pixel portion 35, and calculates 2σ as the first threshold value. In a case where it is assumed that the pixel signals of the effective pixel portion 35 follow a normal distribution of an average value μ and a dispersion $σ^2$, the number of effective pixels of which pixel signals have values in a range of μ±σ is 68.27% of the entire effective pixels, the number of effective pixels of which pixel signals have values in a range of μ±2σ is 95.45% of the entire effective pixels, and the number of effective pixels of which pixel signals have values in a range of μ±3σ is 99.73% of the entire effective pixels. In consideration of this, the variation correction unit 64 calculates the first threshold value (=2σ) for determining the presence and absence of occurrence of noise using the standard deviation σ of the pixel signals of the effective pixel portion 35. The first threshold value is set as an appropriate value in a range where the presence and absence of occurrence of noise can be determined with necessary accuracy. For example, the first threshold value may be set as a fixed value that is set in advance, and the calculation of the first threshold value may not be performed.

Further, the variation correction unit 64 sets i indicating a pixel number to an initial value (i=1) (S42), selects an i-th pixel signal, and determines whether a difference between a value of a pixel signal of the i-th effective pixel and an average value of peripheral pixels thereof satisfies the first threshold value condition (S43). Here, if an absolute value of a difference between the value of the pixel signal of the i-th effective pixel and an average value of eight peripheral pixels that are included in a range of 3×3 pixels around the i-th effective pixel is equal to or smaller than the first threshold value (=2σ), it is determined that the first threshold value condition is satisfied (S43, YES), and it is determined that there is occurrence of noise due to a variation of pixel signals in the i-th effective pixel. Then, correction of the pixel signal based on Expression (2) is performed (S44).

Subsequently, the variation correction unit 64 determines whether a termination condition (i=n) is satisfied (S45). Further, in a case where the termination condition is not satisfied (i!=n) (S45, NO), the variation correction unit 64 increases i indicating the pixel number by 1 (S46), and performs the process of S43 (and S44 in the case of YES in S43) with respect to the next effective pixel.

On the other hand, in a case where the absolute value of the difference between the value of the pixel signal of the i-th effective pixel and the average value of the pixel signals of the peripheral pixels thereof is larger than the first threshold value, the variation correction unit 64 determines that the first threshold value condition is not satisfied (S43, NO), and determines whether the termination condition (i=n) is satisfied (S45). Further, in a case where the termination condition is not satisfied (i!=n) (S45, NO), the variation correction unit 64 increases i indicating the pixel number by 1 (S46), and performs the process of S43 (and S44 in the case of YES in S43) with respect to the next effective pixel. Further, the variation correction unit 64 repeats the processes shown in S43 to S46 until the termination condition is satisfied (i=n), and then, terminates the variation correction.

According to the eighth embodiment, in a case where a difference between a value of a pixel signal of an effective pixel and an average value of pixel signals of a plurality of peripheral pixels that are positioned in the vicinity of the effective pixel satisfies the first threshold value condition, it is possible to perform a variation correction process of reducing noise such as averaging using the pixel signals of the peripheral pixels as the pixel signal of the effective pixel. As a result, it is possible to appropriately perform the variation correction process only with respect to a pixel signal for which it is determined that there is occurrence of noise in an infrared image among image signals of the effective pixel portion 35. As the average value of the pixel signals of the plurality of peripheral pixels that are positioned in the vicinity of the effective pixel, an average value of effective pixels that are arbitrarily selected except for the central effective pixel from a plurality of effective pixels that are included in a range of 3×3 pixels or 5×5 pixels around the effective pixel that is target may be used.

Further, since the first threshold value is set as an appropriate value for determining the presence and absence of occurrence of noise on the basis of the standard deviation σ of the pixel signals of the effective pixel portion 35, it is possible to determine the presence and absence of occurrence of noise with high accuracy even with respect to infrared images having different variations of image signals, to thereby appropriately perform the variation correction process. In order to obtain the above-mentioned effects, for example, g*σ (g is a constant (fixed number) that is equal to or greater than 1 and equal to or smaller than 3) may be used as the first threshold value. In this case, an appropriate value may be appropriately selected as the constant g so as to determine the presence and absence of occurrence of noise with necessary accuracy. In other embodiments of the invention, similarly, a selective variation correction shown in the eighth embodiment may be performed.

According to the respective embodiments of the invention, the above-mentioned effects may also be suitably obtained with respect to noise that is generated on the basis of infrared rays (a wavelength of 0.7 μm to 1 mm), particularly, far infrared rays (a wavelength of 4 μm to 1 mm). The infrared imaging device 1 according to the respective embodiments of the invention may be suitably applied to an imaging device for crime prevention, an in-vehicle imaging device, or the like, and may be configured as a single imaging device that captures an infrared image or may be embedded in an imaging system having an imaging function for an infrared image.

The above-described embodiments are merely examples, and the entire description should not be used to limitatively interpret a technical scope of the invention. Embodiments of the invention are not limited to the above-described examples (first to eighth embodiments, modification examples thereof and application examples), and any combination of the respective elements of the individual embodiments is included in the invention. Further, various modifications that are conceivable by those skilled in the art are also included in the invention. That is, various additions, changes and partial deletions may be made in a range without departing from a conceptual idea and spirit of the invention derived from the content defined in claims and equivalents thereof.

EXPLANATION OF REFERENCES

1: infrared imaging device
2: optical system
3: detection unit
4: analog signal processing circuit
5: conversion circuit
6: signal correction unit
7: output unit
8: storage unit
9: shield unit
31: first image sensor 32: second image sensor
35: effective pixel portion
36: reference pixel portion
36A to 36D, 36E: partial reference pixel portion
61: selection unit
62: variation calculation unit
63: correction intensity calculation unit
64: variation correction unit
IR: imaging region
AR: effective region
BR: reference region
BP: substrate

What is claimed is:

1. An infrared imaging device comprising:
an optical system;
a detection unit that includes an effective pixel portion in which effective pixels that are infrared detection elements are arranged in a matrix form in an effective region onto which infrared rays from the optical system are incident and a reference pixel portion in which a plurality of reference pixels that are the infrared detection elements are arranged in a reference region onto which the infrared rays from the optical system are not incident, and is positioned on an imaging surface of the optical system; and
a signal correction unit that performs a correction process with respect to a pixel signal detected by the detection unit,
wherein the signal correction unit performs a variation correction process of calculating a reference variation value indicating a variation of pixel signals of the plurality of reference pixels included in the reference pixel portion and reducing a variation of pixel signals of the effective pixels to become smaller as the reference variation value becomes larger, and
the variation correction process includes calculating, with respect to a pixel signal of each of the effective pixels, an average value of pixel signals of a plurality of vicinity effective pixels, which vicinity effective pixels are pixels other than the effective pixels positioned in a specific range among the effective pixels, and correcting the pixel signal of the effective pixel on the basis of an addition average value of the pixel signals of the effective pixels and the average value of the pixel signals of the plurality of the vicinity effective pixels, so that a difference between the value of the pixel signal of the effective pixel and the average value of the pixel signals of the plurality of the vicinity effective pixels becomes smaller, to thereby reduce the variation of the pixel signal of the effective pixel.

2. The infrared imaging device according to claim 1,
wherein the detection unit is configured as a single image sensor that includes the reference pixel portion and the effective pixel portion.

3. The infrared imaging device according to claim 2,
wherein the reference pixel portion includes a plurality of partial reference pixel portions that are positioned to be adjacent to the effective pixel portion.

4. The infrared imaging device according to claim 3,
wherein the signal correction unit calculates, with respect to each of the plurality of partial reference pixel portions, a partial reference variation value indicating a variation of the partial reference pixel portion, and determines an average value of the plurality of partial reference variation values as the reference variation value.

5. The infrared imaging device according to claim 3,
wherein the signal correction unit calculates, with respect to each of the plurality of partial reference pixel portions, a partial reference variation value, and determines a maximum value or a minimum value of the plurality of partial reference variation values as the reference variation value.

6. The infrared imaging device according to claim 1,
wherein the plurality of partial reference pixel portions include first and second partial reference pixel portions that face each other with the center of the effective region being interposed therebetween in a first direction, and third and fourth partial reference pixel portions that face each other with the center of the effective region being interposed therebetween in a second direction different from the first direction.

7. The infrared imaging device according to claim 1,
wherein the detection unit includes a first image sensor having the effective pixel portion and a second image sensor that has the same temperature characteristic as that of the first image sensor and has the reference pixel portion, and the second image sensor is positioned in the vicinity of the first image sensor.

8. The infrared imaging device according to claim 7,
wherein the reference pixels are provided on an entire detection surface of the second image sensor, and
wherein the signal correction unit calculates the reference variation value indicating a variation of the pixel signals of all the reference pixels included in the reference pixel portion.

9. The infrared imaging device according to claim 1,
wherein the reference pixel portion is provided at a position excluding an imaging region of the optical system.

10. The infrared imaging device according to claim 1, further comprising:
a shield unit that shields incidence of infrared rays onto the reference pixels from the optical system.

11. The infrared imaging device according to claim 10,
wherein the signal correction unit performs the variation correction process in a case where the difference between the value of the pixel signal of the effective pixel and the average value of the pixel signals of the plurality of the vicinity effective pixels with respect to the effective pixel satisfies a first threshold value condition.

12. The infrared imaging device according to claim 1,
wherein the signal correction unit calculates the reference variation value, calculates a correction intensity indicating the degree of reduction of the variation of the pixel signals of the effective pixels according to the calculated reference variation value, and reduces the variation of the pixel signals of the effective pixels to become smaller according to the calculated correction intensity to thereby perform the variation correction process, and
wherein the signal correction unit performs a correction intensity updating process of calculating the reference variation value and updating and calculating the correction intensity according to the calculated reference variation value.

13. The infrared imaging device according to claim 12,
wherein the signal correction unit acquires a pixel signal of the reference pixel portion, and in a case where a difference between the acquired pixel signal of the reference pixel portion and a pixel signal of the reference pixel portion in the previous correction intensity calculation process satisfies a second threshold value condition, the signal correction unit performs the correction intensity updating process.

14. A signal correction method using an infrared imaging device including an optical system, a detection unit that includes an effective pixel portion in which effective pixels that are infrared detection elements are arranged in a matrix form in an effective region onto which infrared rays from the optical system are incident and a reference pixel portion in which a plurality of reference pixels that are the infrared detection elements are arranged in a reference region onto which the infrared rays from the optical system are not incident, and is positioned on an imaging surface of the optical system, and a signal correction unit that performs a correction process with respect to a pixel signal detected by the detection unit, the method comprising:

a detection step of detecting pixel signals of the effective pixels and pixel signals of the reference pixels; and a signal correction step of performing a variation correction process of calculating a reference variation value indicating a variation of the pixel signals of the plurality of reference pixels included in the reference pixel portion and reducing a variation of the pixel signals of the effective pixels to become smaller as the reference variation value becomes larger wherein the variation correction process includes calculating, with respect to a pixel signal of each of the effective pixels, an average value of pixel signals of a plurality of vicinity effective pixels, which vicinity effective pixels are pixels other than the effective pixels positioned in a specific range among the effective pixels, and correcting the pixel signal of the effective pixel on the basis of an addition average value of the pixel signals of the effective pixels and the average value of the pixel signals of the plurality of the vicinity effective pixels, so that a difference between the value of the pixel signal of the effective pixel and the average value of the pixel signals of the plurality of the vicinity effective pixels becomes smaller, to thereby reduce the variation of the pixel signal of the effective pixel.

* * * * *